(12) United States Patent
Xu et al.

(10) Patent No.: US 12,009,809 B2
(45) Date of Patent: Jun. 11, 2024

(54) DRIVE MODULE FOR GaN TRANSISTOR, SWITCH CIRCUIT AND ELECTRONIC DEVICE

(71) Applicant: Fudan University, Shanghai (CN)

(72) Inventors: Min Xu, Shanghai (CN); Jian Jin, Shanghai (CN); Mengyuan Sun, Shanghai (CN); Bin Wang, Shanghai (CN); Wei Zhang, Shanghai (CN)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 17/828,800

(22) Filed: May 31, 2022

(65) Prior Publication Data

US 2023/0387906 A1 Nov. 30, 2023

(51) Int. Cl.
*H03K 17/16* (2006.01)
(52) U.S. Cl.
CPC .................................. *H03K 17/161* (2013.01)
(58) Field of Classification Search
CPC ......... H03K 17/161; H03K 2217/0072; H03K 17/04123
See application file for complete search history.

(56) References Cited

U.S. PATENT DOCUMENTS

| | | | | |
|---|---|---|---|---|
| 6,271,709 B1* | 8/2001 | Kimura | ................. | H03K 17/168 327/434 |
| 6,490,182 B2* | 12/2002 | Katoh | .................. | H03K 17/168 363/56.05 |
| 7,570,085 B2* | 8/2009 | Ishikawa | ............ | H03K 17/0406 327/108 |
| 7,889,477 B2* | 2/2011 | Neubarth | ............ | H02M 3/3384 361/212 |
| 9,312,848 B2* | 4/2016 | Zhang | .................. | H03K 17/161 |
| 9,379,022 B2* | 6/2016 | Pendharkar | ..... | H01L 21/823462 |
| 2012/0176116 A1* | 7/2012 | Kitagawa | ............. | H03K 17/163 323/312 |

FOREIGN PATENT DOCUMENTS

CN 109962604 A 7/2019

\* cited by examiner

*Primary Examiner* — Ryan Johnson
*Assistant Examiner* — Colleen J O Toole
(74) *Attorney, Agent, or Firm* — Zhu Lehnhoff LLP

(57) ABSTRACT

The present invention provides a drive module for a GaN transistor, including: a first pull-down transistor and a gate ringing and overshoot suppression unit, where the gate ringing and overshoot suppression unit and a first end of the first pull-down transistor are directly or indirectly connected to a gate of the GaN transistor, the gate ringing and overshoot suppression unit is connected between a second end of the first pull-down transistor and the ground; the gate ringing and overshoot suppression unit is configured to: when a gate voltage of the GaN transistor drops, control the release of a gate charge of the GaN transistor with a first impedance if the gate voltage is higher than a specified threshold; and control the release of the gate charge of the GaN transistor with a second impedance if the gate voltage is less than the specified threshold, where the first impedance is less than the second impedance.

19 Claims, 4 Drawing Sheets

DRIVE MODULE FOR GaN TRANSISTOR, SWITCH CIRCUIT AND ELECTRONIC DEVICE

TECHNICAL FIELD

The present invention relates to the field of driving of a GaN transistor, and in particular to a drive module for a GaN transistor, a switch circuit and an electronic device.

BACKGROUND

A GaN transistor can be understood as a transistor formed based on GaN materials. Such GaN transistor can be, for example, an NMOS transistor formed based on the GaN materials, and can be turned on and off under the drive of a drive module.

In the related prior art, a gate of the GaN transistor can be grounded through a pull-down transistor. When the pull-down transistor is driven to be turned on, the pull-down of the gate of the GaN transistor can be realized, and thus, the GaN transistor can be turned off.

However, GaN has a very high switching speed, so a change rate of a gate current is slow (it can be understood as large di/dt). Under the action of gate parasitic inductance (mainly parasitic inductance due to a PCB and packaging), a large gate ringing and overshoot voltage will be produced to significantly affect the stability of the GaN transistor.

SUMMARY

The present invention provides a drive module for a GaN transistor, a switch circuit and an electronic device, in order to solve the problem that a gate ringing and overshoot voltage affects the stability of the GaN transistor.

According to a first aspect of the present invention, a drive module for a GaN transistor is provided, including: a first pull-down transistor and a gate ringing and overshoot suppression unit, where a first end of the first pull-down transistor is directly or indirectly connected to a gate of the GaN transistor, the gate ringing and overshoot suppression unit is connected between a second end of the first pull-down transistor and the ground, and the gate ringing and overshoot suppression unit is also directly or indirectly connected to the gate of the GaN transistor;

the gate ringing and overshoot suppression unit is configured to:
when a gate voltage of the GaN transistor drops, control the release of a gate charge of the GaN transistor with a first impedance if the gate voltage is higher than a specified threshold; and control the release of the gate charge of the GaN transistor with a second impedance if the gate voltage is less than the specified threshold, where the first impedance is less than the second impedance.

Optionally, the gate ringing and overshoot suppression unit includes a second pull-down transistor and a pull-down resistor; and
a first end of the pull-down resistor is connected to the second end of the first pull-down transistor, a second end of the pull-down resistor is connected to the ground, a first end of the second pull-down transistor is connected to the second end of the first pull-down transistor, a second end of the second pull-down transistor is connected to the ground, and a gate of the second pull-down transistor is connected to the gate of the GaN transistor.

Optionally, the first pull-down transistor and the second pull-down transistor are NMOS transistors, the first end of the first pull-down transistor is a drain of the first pull-down transistor, and the second end of the first pull-down transistor is a source of the first pull-down transistor; the first end of the second pull-down transistor is a drain of the second pull-down transistor, and the second end of the second pull-down transistor is a source of the second pull-down transistor.

Optionally, the specified threshold matches a zero-volt voltage.

Optionally, the drive module further includes: a drive unit and a pull-up transistor;
an input side of the drive unit is used to access a control signal of the GaN transistor, a first end of the pull-up transistor is used to access a voltage source, a second end of the pull-up transistor is directly or indirectly connected to the gate of the GaN transistor, and a gate of the pull-up transistor and the gate of the first pull-down transistor are connected to an output side of the drive unit; and
the drive unit is configured to control, according to the control signal, one of the pull-up transistor and the first pull-down transistor to turn on.

Optionally, the drive unit includes a logical driver, an input side of the logical driver is used to directly or indirectly access the control signal; an output side of the logical driver is connected to the gate of the pull-up transistor and the gate of the first pull-down transistor; and
the logical driver is configured to:
control the pull-up transistor to turn on and the first pull-down transistor to turn off when the control signal is a first control signal; and
control the pull-up transistor to turn off and the first pull-down transistor to turn on when the control signal is a second control signal.

Optionally, the drive unit further includes a noise reduction part, an input side of the noise reduction part is used to access the control signal, an output side of the noise reduction part is connected to the input side of the logical driver, and the noise reduction part is used to input the control signal into the logical driver after noise reduction.

Optionally, the control signal includes a forward input signal and a reverse input signal;
the noise reduction part includes a first Schmitt trigger and a second Schmitt trigger; and
an input end of the first Schmitt trigger is used to access the forward input signal, an input end of the second Schmitt trigger is used to access the reverse input signal, and an output end of the first Schmitt trigger and an output end of the second Schmitt trigger are connected to the input side of the logical driver.

Optionally, the pull-up transistor is a PMOS transistor, the first end of the pull-up transistor is a source of the pull-up transistor, and the second end of the pull-up transistor is a drain of the pull-up transistor.

Optionally, the drive module is arranged on a same chip.

According to a second aspect of the present invention, a switch circuit is provided, including a drive module involved in the first aspect and its optional solutions, and the GaN transistor.

According to a third aspect of the present invention, an electronic device is provided, including a switch circuit involved in the second aspect and its optional solutions.

In the drive module for a GaN transistor, switch circuit and electronic device provided by the present invention, the present invention can realize the release of a gate charge under two different impedances in the process of using the drive module to drive the GaN transistor to turn off, where when a gate voltage of the GaN transistor drops, the release of a gate charge of the GaN transistor is controlled with a first impedance if the gate voltage is higher than a specified threshold; the release of the gate charge of the GaN transistor is controlled with a second impedance higher than the first impedance, if the gate voltage is less than the specified threshold; and thus, the larger second impedance can slow down a current change rate, reduce di/dt, avoid or reduce a gate ringing and overshoot voltage and ensure the stability of the GaN transistor.

Meanwhile, in this process, the release of the gate charge of the GaN transistor can be controlled by the second impedance only when the gate voltage of the GaN transistor is low, that is, a decline speed starts to slow down only when the gate voltage of the GaN transistor drops near the specified threshold (e.g., 0 V). Thus, it will not affect an initial decline speed of the gate voltage of the GaN transistor. It not only suppresses the gate ringing and overshoot, but also does not significantly reduce the decline speed, so it effectively takes into account both the suppression of the gate ringing and overshoot and the change rate of the gate current.

BRIEF DESCRIPTION OF DRAWINGS

In order to explain the technical solutions in the embodiments of the present invention or in the prior art more clearly, the drawings used in the description of the embodiments or the prior art will be briefly introduced below. Obviously, the drawings in the following description are merely some embodiments of the present invention. For those of ordinary skill in the art, other drawings can be obtained based on these drawings without creative efforts.

DESCRIPTION OF REFERENCE SIGNS IN THE DRAWINGS

Figure 1:
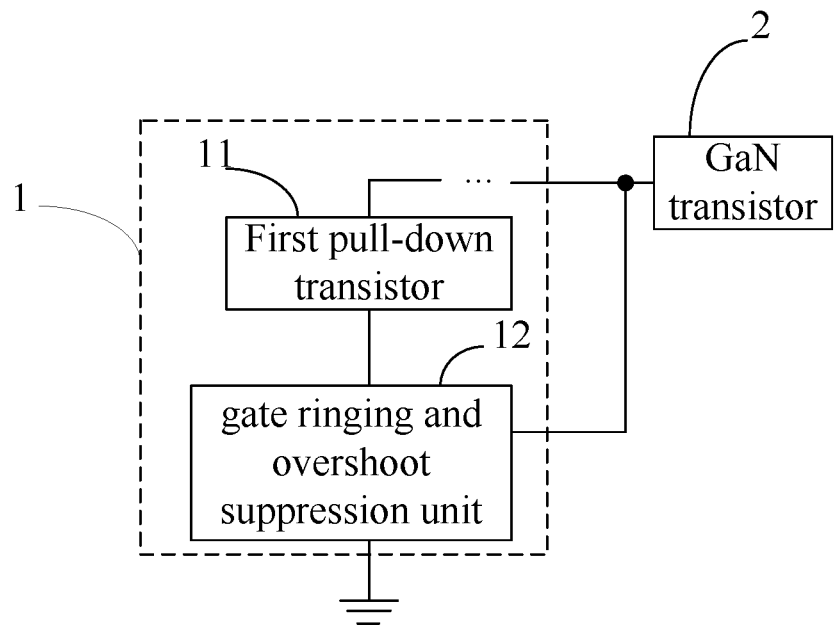
FIG. 1 is a schematic diagram I of a structure of a GaN transistor and its drive module according to an embodiment of the present invention.
Figure 2:
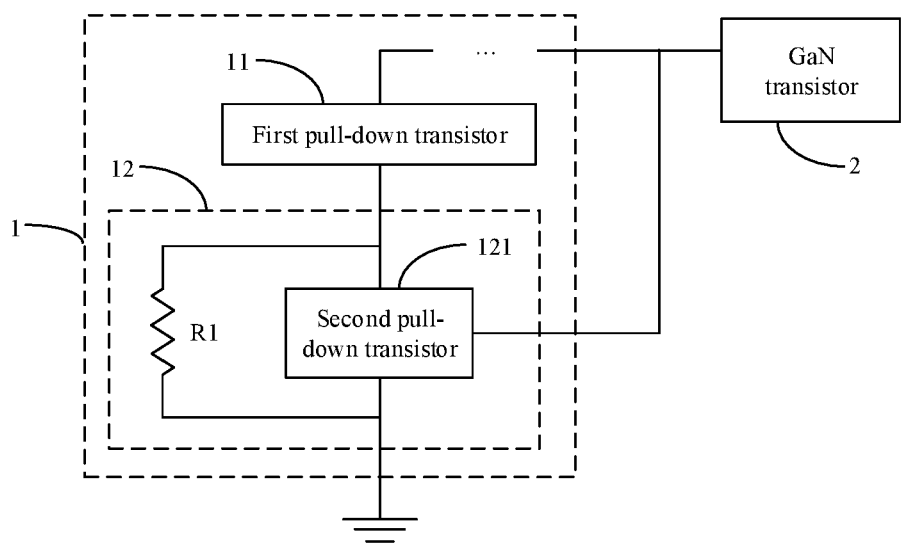
FIG. 2 is a schematic diagram II of a structure of a GaN transistor and its drive module according to an embodiment of the present invention.

1—drive module;
11—first pull-down transistor;
12—gate ringing and overshoot suppression unit;
121—second pull-down transistor;
13—pull-up transistor;
14—drive unit;
141—logical driver;
142—noise reduction part;
1421—first Schmitt trigger;
1422—second Schmitt trigger;
3—chip;
NMOS1—first pull-down transistor;
NMOS2—second pull-down transistor;
$NMOS_{GaN}$—GaN transistor;
PMOS—pull-up transistor;
R1—pull-down resistor;
R2—pull-up connection resistor;
R3—pull-down connection resistor.

DESCRIPTION OF EMBODIMENTS

The following clearly and completely describes the technical solutions in the embodiments of the present invention with reference to the accompanying drawings in the embodiments of the present invention. Obviously, the described embodiments are merely some but not all of embodiments of the present invention. Based on the embodiments of the present invention, all other embodiments obtained by those of ordinary skill in the art without creative efforts should fall within the protection scope of the present invention.

In the specification, claims and accompanying drawings of the present invention, the terms "first", "second", "third", "fourth" and so on (if any) are intended to distinguish between similar objects but do not necessarily indicate a specific order or sequence. It should be understood that the terms so used may be interchanged where appropriate, so that the embodiments described herein can be implemented in a sequence other than what is illustrated or described herein. Furthermore, the terms "comprise" and "include" and any variations thereof are intended to cover a non-exclusive inclusion, such that a process, method, system, product or apparatus that includes a list of steps or units does not include only those steps or units, but may include other steps or units not explicitly listed or inherent to such process, method, product or apparatus.

The technical solutions of the present invention will be described in detail with reference to specific embodiments below. The following specific embodiments may be combined with each other, and details of the same or similar concepts or processes may not be repeated in some embodiments.

Referring to FIG. 1 to FIG. 5, a drive module for a GaN transistor includes: a first pull-down transistor 11 and a gate ringing and overshoot suppression unit 12.

A first end of the first pull-down transistor 12 is directly or indirectly connected to a gate of the GaN transistor 2, the gate ringing and overshoot suppression unit 12 is connected between a second end of the first pull-down transistor 11 and the ground, and the gate ringing and overshoot suppression unit 12 is also directly or indirectly connected to the gate of the GaN transistor 2.

The gate ringing and overshoot suppression unit 12 is configured to:
when a gate voltage of the GaN transistor 2 drops, control the release of a gate charge of the GaN transistor 2 with a first impedance if the gate voltage is higher than a specified threshold; and control the release of the gate charge of the GaN transistor with a second impedance if the gate voltage is less than the specified threshold, where the first impedance is less than the second impedance.

The first impedance and second impedance can be understood as any impedance values or impedance range values that change a current change rate. Moreover, since the second impedance is greater than the first impedance, the current drops quickly when the second impedance is used to release the charge, but drops slowly when the first impedance is used to release the charge. Meanwhile, any way of changing the impedance can be used as an implementation of the embodiment of the present invention. For example, this can be realized by connecting a resistor or not connecting a resistor, by connecting different values and quantities of resistors, or by connecting different transistors (such as transistors of different sizes, models and quantities).

In the above solution, the present invention can realize the release of a gate charge under two different impedances in the process of using the drive module to drive the GaN transistor to turn off, where the larger second impedance can slow down a current change rate, reduce di/dt, avoid or reduce a gate ringing and overshoot voltage and ensure the stability of the GaN transistor.

Meanwhile, in this process, the release of the gate charge of the GaN transistor can be controlled by the second impedance only when the gate voltage of the GaN transistor is low, that is, a decline speed starts to slow down only when the GaN gate voltage drops near the specified threshold (e.g., 0 V). Thus, it will not affect an initial decline speed of the gate voltage of the GaN transistor. It not only suppresses the gate ringing and overshoot, but also does not significantly reduce the decline speed, so it effectively takes into account both the suppression of the gate ringing and overshoot and the change rate of the gate current.

Furthermore, the creative contribution of the embodiment of the present invention is not only reflected in the switching of the first impedance and the second impedance, but also reflected in: creatively discovering the adverse influence of parasitic inductance and a gate ringing and overshoot voltage of the GaN transistor. Any solution explored not based on this influence cannot inspire the solution of the embodiment of the present invention.

In an implementation, referring to FIG. 2 to FIG. 5, the gate ringing and overshoot suppression unit 12 includes a second pull-down transistor 121 and a pull-down resistor R1.

A first end of the pull-down resistor R1 is connected to the second end of the first pull-down transistor 11, a second end of the pull-down resistor R1 is connected to the ground, a first end of the second pull-down transistor 121 is connected to the second end of the first pull-down transistor 11, a second end of the second pull-down transistor 121 is connected to the ground, and a gate of the second pull-down transistor 121 is connected to the gate of the GaN transistor 2.

On/off of the second pull-down transistor 121 is controlled based on the gate voltage of the GaN transistor 2, so the action of an impedance change based on the specified threshold in the above gate ringing and overshoot suppression unit can be realized by referring to the on-off action of the second pull-down transistor 121. Accordingly, the specified threshold can match a turn-on voltage of the second pull-down transistor 121.

Figure 5:
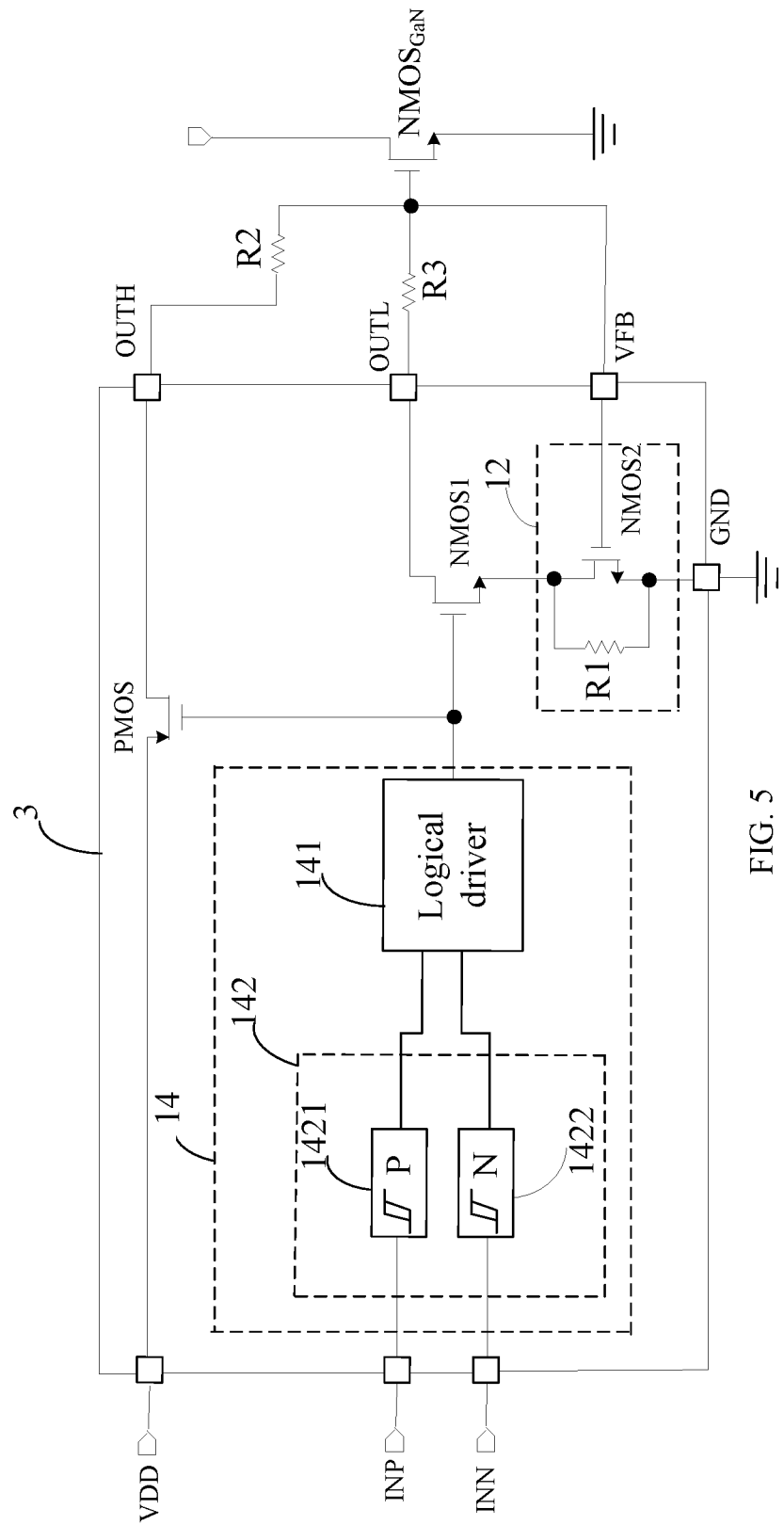
FIG. 5 is a schematic diagram of a circuit of a GaN transistor and its drive module according to an embodiment of the present invention.

To be specific, the first pull-down transistor 11 and the second pull-down transistor 121 are NMOS transistors, and thus, the first pull-down transistor 11 can be understood as the first pull-down transistor NMOS1 shown in FIG. 5, and the second pull-down transistor 121 can be understood as the second pull-down transistor NMOS2 shown in FIG. 5. Meanwhile, the GaN transistor 2 can be a GaN transistor $NMOS_{GaN}$. In other solutions, other transistors (such as triode) can be also adopted as the pull-down transistor mentioned above, and other transistors (such as a triode and a PMOS transistor) can be also adopted as the GaN transistor.

Referring to FIG. 5, the first end of the first pull-down transistor NMOS1 is a drain of the first pull-down transistor NMOS1, and the second end of the first pull-down transistor NMOS1 is a source of the first pull-down transistor NMOS1; the first end of the second pull-down transistor NMOS2 is a drain of the second pull-down transistor NMOS2, and the second end of the second pull-down transistor NMOS2 is a source of the second pull-down transistor NMOS2.

In a specific example, the specified threshold can match a zero-volt voltage. For example, the specified threshold can be a zero-volt voltage or a near zero-volt voltage.

Based on the circuit shown in FIG. 5, after the second pull-down transistor NMOS2 and the pull-down resistor R1 are connected in parallel, a feedback voltage is introduced from the gate of the GaN transistor $NMOS_{GaN}$ back into a chip (i.e., in a chip 3 provided with the drive module 1), so as to control the gate of the second pull-down transistor NMOS2.

When the GaN transistor $NMOS_{GaN}$ is turned from on to off (i.e., turn off due to pull-down), the gate voltage of the GaN transistor $NMOS_{GaN}$ can drop from a high level to 0 V.

When the gate voltage of the GaN transistor $NMOS_{GaN}$ has not dropped to 0 V, the second pull-down transistor NMOS2 remains on, and the gate charge of the GaN transistor $NMOS_{GaN}$ releases through the first pull-down transistor NMOS1 and the second pull-down transistor NMOS2. The pull-down resistor R1 is so small that the decline speed will not be affected.

When the gate voltage of the GaN transistor $NMOS_{GaN}$ drops to 0 V, the second pull-down transistor NMOS2 is turned off, and the gate charge of the GaN transistor $NMOS_{GaN}$ releases through the pull-down resistor R1. The pull-down resistor R1 can slow down the change of di/dt, so as to suppress the gate ringing and overshoot.

In this solution, the initial decline speed of the GaN gate voltage will not be affected, and the decline speed starts to slow down only when the gate voltage of the GaN transistor $NMOS_{GaN}$ drops to near 0. It suppresses the gate ringing and overshoot, but does not significantly reduce the decline speed.

Figure 3:
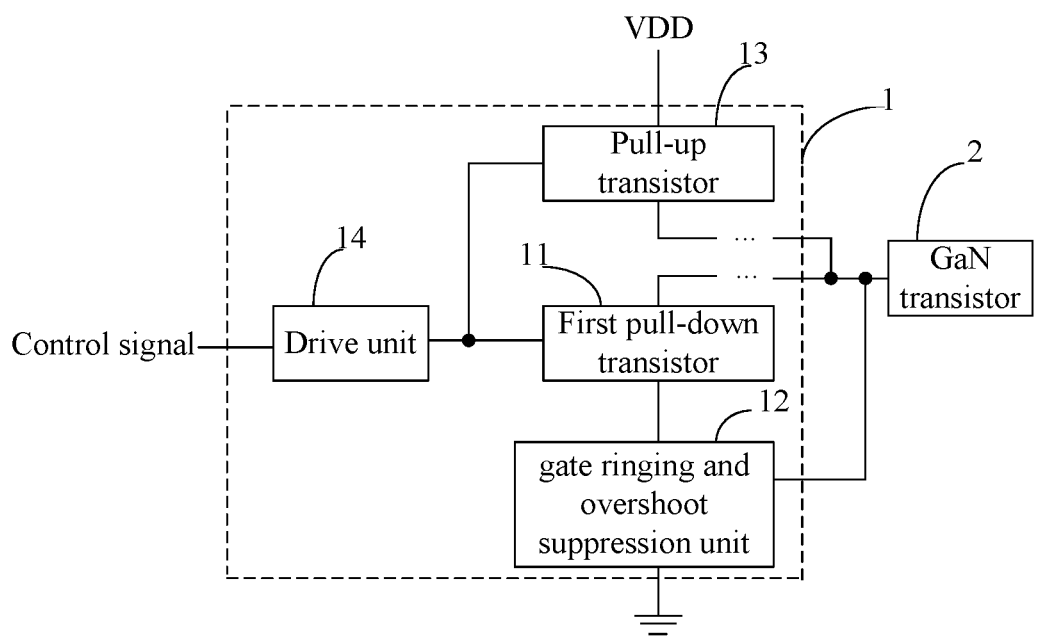
FIG. 3 is a schematic diagram III of a structure of a GaN transistor and its drive module according to an embodiment of the present invention.
Figure 4:
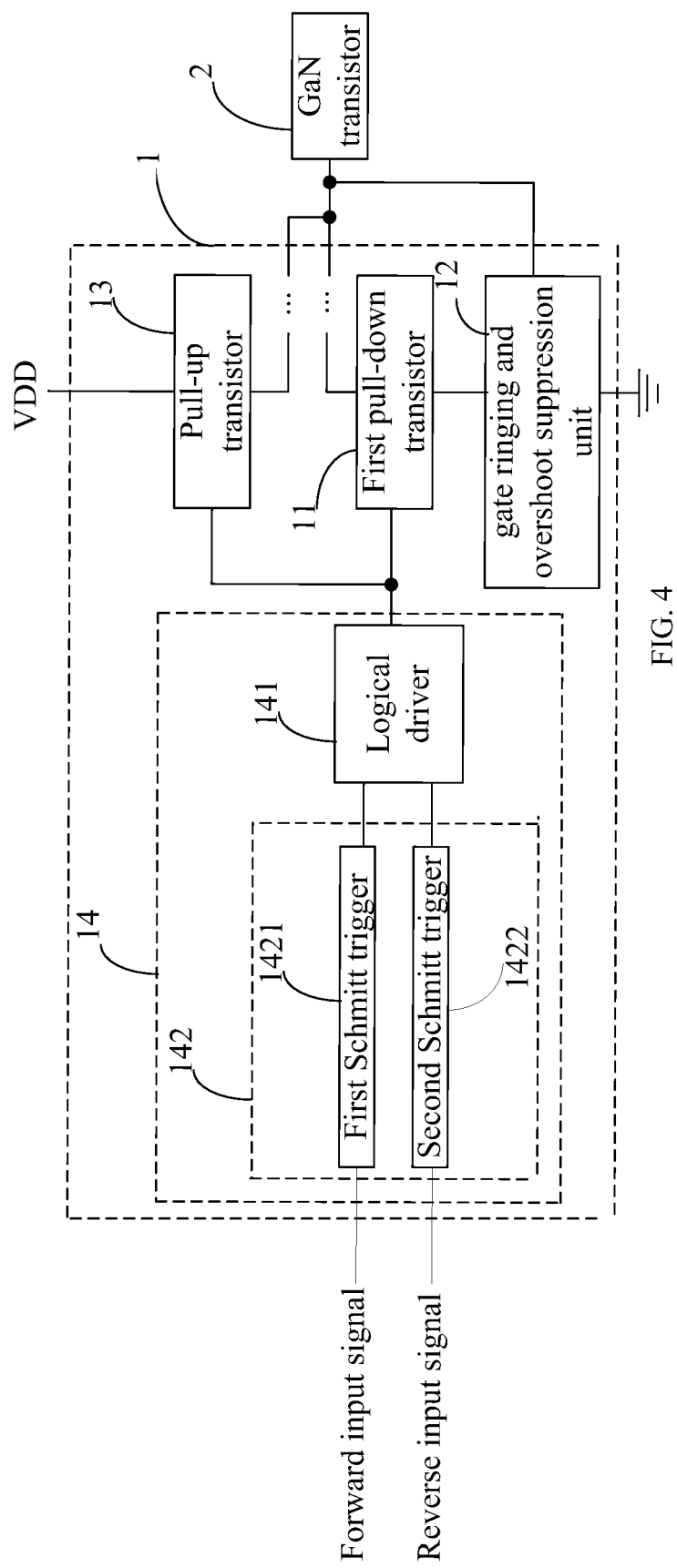
FIG. 4 is a schematic diagram IV of a structure of a GaN transistor and its drive module according to an embodiment of the present invention.

In one implementation, referring to FIG. 3 to FIG. 5, the drive module 1 further includes: a drive unit 14 and a pull-up transistor 13.

An input side of the drive unit 14 is used to access a control signal of the GaN transistor, a first end of the pull-up transistor 13 is used to access a voltage source, a second end of the pull-up transistor 13 is directly or indirectly connected to the gate of the GaN transistor 2, and a gate of the pull-up transistor 13 and the gate of the first pull-down transistor 11 are connected to an output side of the drive unit 14.

The drive unit is configured to control, according to the control signal, one of the pull-up transistor and the first pull-down transistor to turn on.

Thus, the gate of the pull-up transistor 13 and the gate of the first pull-down transistor 11 can access a same driving signal sent by the drive unit 14. In some solutions, different driving signals can also be accessed from the drive unit 14. Regardless of the driving form, as long as the pull-up transistor and the first pull-down transistor are turned on alternatively, it is not out of the scope of the above solution.

The pull-up transistor 13 can drive the GaN transistor 2 to turn on or off through the gate pull-up of the GaN transistor 2, and the pull-down transistor can drive the GaN transistor 2 to turn off or on through the gate pull-down of the GaN transistor 2. Based on different types of the GaN transistor, the driving results of pull-up and pull-down on the GaN transistor may be different.

The pull-up transistor 13 can be a PMOS transistor, i.e., the pull-up transistor 13 can be the pull-up transistor PMOS shown in FIG. 5. Referring to FIG. 5, the first end of the pull-up transistor PMOS is a source of the pull-up transistor PMOS, and the second end of the pull-up transistor PMOS is a drain of the pull-up transistor PMOS.

In a further solution, referring to FIG. 4 and FIG. 5, the drive unit 14 includes a logical driver 141, and an input side of the logical driver 141 is used to directly or indirectly access the control signal; an output side of the logical driver 141 is connected to the gate of the pull-up transistor 13 and the gate of the first pull-down transistor 11.

The logical driver 141 is configured to:
control the pull-up transistor to turn on and the first pull-down transistor to turn off when the control signal is a first control signal; and
control the pull-up transistor to turn off and the first pull-down transistor to turn on when the control signal is a second control signal.

The control signal can be, for example, associated with a PWM signal. When the PWM signal is high, the control signal is the first control signal, and when the PWM signal is low, the control signal is the second control signal; or when the PWM signal is high, the control signal is the second control signal, and when the PWM signal is low, the control signal is the first control signal.

The logical driver can use a required logic gate to realize the above process based on the type of transistor and the type of the first control signal and the second control signal. Thus, it can be realized through the hardware mode of device selection and combination. In one example, the logical driver may be, for example, an AND gate.

Furthermore, if a change occurs to factors to be considered in driving, the logical driver can also integrate more complex logic gates, or adopt multiple logic gates (such as an AND gate, a NOT gate, a NAND gate or a NOR gate, or a combination of at least two of the above logic gates).

In one implementation, the drive unit 14 further includes a noise reduction part 142, an input side of the noise reduction part 142 is used to access the control signal, an output side of the noise reduction part 142 is connected to the input side of the logical driver 141, and the noise reduction part 142 is used to input the control signal into the logical driver 141 after noise reduction.

In one implementation, the control signal includes a forward input signal and a reverse input signal; in one example, the forward input signal and/or reverse input signal can form a PWM signal, and if only the forward input signal is used to form the PWM signal, the reverse input may be, for example, an enable signal or other signals associated with the enable signal.

The noise reduction part may include a first Schmitt trigger 1421 and a second Schmitt trigger 1422; and
an input end of the first Schmitt trigger 1421 is used to access the forward input signal, an input end of the second Schmitt trigger 1422 is used to access the reverse input signal, and an output end of the first Schmitt trigger 1421 and an output end of the second Schmitt trigger 1422 are connected to the input side of the logical driver 141. In case that the logical driver 141 adopts an AND gate, it can output a high level when the forward input signal and reverse input signal are high, and output a low level when the forward input signal and/or reverse input signal are low. Thus, when the high level is output, the first pull-down transistor 11 can be controlled to be turned on and the pull-up transistor 13 can be controlled to be turned off, so as to pull down the GaN transistor 2; when the low level is output, the first pull-down transistor 11 can be controlled to be turned off and the pull-up transistor 13 can be controlled to be turned on, so as to pull up the GaN transistor 2.

The influence of input noise on the system can be reduced through the above-mentioned noise reduction part (such as a Schmitt trigger). In other optional solutions, other circuit structures other than the Schmitt trigger can also be used to reduce noise (for example, a capacitor, an inductor and other devices can be used to reduce noise).

In one implementation, referring to FIG. 5, the drive module 1 is arranged on a same chip 3. Thus, external connection can be implemented based on a corresponding pin on the chip 3, for example:

the pull-up transistor PMOS can be connected to a voltage source through a VDD pin, where this voltage source use a capacitor to realize constant voltage input, and the pull-up transistor PMOS can be connected to the gate of the GaN transistor $NMOS_{GaN}$ through an OUTH pin of the chip 3 and a pull-up connection resistor R2 outside the chip 3;

the first pull-down transistor NMOS1 can be connected to the gate of the GaN transistor $NMOS_{GaN}$ through an OUTL pin of the chip 3 and a pull-down connection resistor R3 outside the chip 3;

the gate ringing and overshoot suppression unit 12 (e.g., the gate of the second pull-down transistor NMOS2) can be connected to the gate of the GaN transistor $NMOS_{GaN}$ through a VFB pin of the chip 3; and the gate ringing and overshoot suppression unit 12 (e.g., the source of the second pull-down transistor NMOS2) can be connected to the ground through a GND pin of the chip 3.

An embodiment of the present invention further provides a switch circuit, including the drive module 1 involved in the above optional solutions, and the GaN transistor 2.

In addition, the switch circuit further includes a circuit structure capable of providing a voltage source and/or a control signal to the drive module 1, such as a capacitor for providing the voltage source, a control module for generating a control signal, a circuit structure for filtering and amplifying the control signal, and a circuit structure for logic conversion of the control signal, an enable signal, etc.

An embodiment of the present invention further provides an electronic device, including the above switch circuit. Thus, the electronic device can be any device that needs to use a GaN transistor, and the role of the GaN transistor in the device can be configured arbitrarily as needed. Regardless of the configuration, it is not out of the scope of the embodiment of the present invention.

In conclusion, in the drive module for a GaN transistor, switch circuit and electronic device provided by the embodiments of the present invention, the present invention can realize the release of a gate charge under two different impedances in the process of using the drive module to drive the GaN transistor to turn off, where when a gate voltage of the GaN transistor drops, the release of a gate charge of the GaN transistor is controlled with a first impedance if the gate voltage is higher than a specified threshold; the release of a gate charge of the GaN transistor is controlled with a second impedance higher than the first impedance if the gate voltage is less than the specified threshold; and thus, the larger second impedance can slow down a current change rate, reduce di/dt, avoid or reduce a gate ringing and overshoot voltage and ensure the stability of the GaN transistor.

Meanwhile, in this process, the release of the gate charge of the GaN transistor can be controlled by the second impedance only when the gate voltage of the GaN transistor is low, that is, a decline speed starts to slow down only when the GaN gate voltage drops near the specified threshold (e.g., 0 V). Thus, it will not affect an initial decline speed of the gate voltage of the GaN transistor. It not only suppresses the gate ringing and overshoot, but also does not significantly reduce the decline speed, so it effectively takes into account both the suppression of the gate ringing and overshoot and the change rate of the gate current.

Finally, it should be noted that the foregoing embodiments are merely intended for describing the technical solutions of the present invention rather than limiting the present invention. Although the present invention is described in detail with reference to the foregoing embodiments, those of ordinary skill in the art should understand that they may still make modifications to the technical solutions described in the foregoing embodiments or make equivalent replacements to some or all technical features thereof, without departing from the scope of the technical solutions of the embodiments of the present invention.

The invention claimed is:

1. A drive module for a GaN transistor, comprising a first pull-down transistor and a gate ringing and overshoot suppression unit, wherein:
   a first end of the first pull-down transistor is directly or indirectly connected to a gate of the GaN transistor, the gate ringing and overshoot suppression unit is connected between a second end of the first pull-down transistor and ground, and the gate ringing and overshoot suppression unit is also directly or indirectly connected to the gate of the GaN transistor;
   the gate ringing and overshoot suppression unit comprises a second pull-down transistor and a pull-down resistor, a first end of the pull-down resistor is connected to the second end of the first pull-down transistor, a second end of the pull-down resistor is connected to ground, a first end of the second pull-down transistor is connected to the second end of the first pull-down transistor, a second end of the second pull-down transistor is connected to ground, and a gate voltage of the GaN transistor is applied to a gate of the second pull-down transistor as an on/off signal which turns the second pull-down transistor on and off, wherein the voltage which is applied to the gate of the second pull-down transistor is always the same as the gate voltage of the GaN transistor; and
   the gate ringing and overshoot suppression unit is configured such that when the gate voltage of the GaN transistor drops, the gate ringing and overshoot suppression unit controls the release of a gate charge of the GaN transistor with a first impedance if the gate voltage is higher than a specified threshold and controls the release of the gate charge of the GaN transistor with a second impedance if the gate voltage is less than the specified threshold, wherein the first impedance is less than the second impedance.

2. The drive module according to claim 1, wherein the first pull-down transistor and the second pull-down transistor are NMOS transistors, the first end of the first pull-down transistor is a drain of the first pull-down transistor, the second end of the first pull-down transistor is a source of the first pull-down transistor, the first end of the second pull-down transistor is a drain of the second pull-down transistor, and the second end of the second pull-down transistor is a source of the second pull-down transistor.

3. The drive module according to claim 1, wherein the specified threshold matches a zero-volt voltage.

4. The drive module according to claim 1, further comprising a drive unit and a pull-up transistor, wherein:
   an input side of the drive unit is used to access a control signal of the GaN transistor, a first end of the pull-up transistor is used to access a voltage source, a second end of the pull-up transistor is directly or indirectly connected to the gate of the GaN transistor, and a gate of the pull-up transistor and the gate of the first pull-down transistor are connected to an output side of the drive unit; and
   the drive unit is configured to control one of the pull-up transistor and the first pull-down transistor to turn on according to the control signal.

5. The drive module according to claim 4, wherein:
   the drive unit comprises a logical driver, an input side of the logical driver is used to directly or indirectly access the control signal, and an output side of the logical driver is connected to the gate of the pull-up transistor and the gate of the first pull-down transistor;
   the logical driver is configured to control the pull-up transistor to turn on and the first pull-down transistor to turn off when the control signal is a first control signal; and
   the logical driver is configured to control the pull-up transistor to turn off and the first pull-down transistor to turn on when the control signal is a second control signal.

6. The drive module according to claim 5, wherein the drive unit further comprises a noise reduction part, an input side of the noise reduction part is used to access the control signal, an output side of the noise reduction part is connected to the input side of the logical driver, and the noise reduction part is used to input the control signal into the logical driver after noise reduction.

7. The drive module according to claim 6, wherein:
   the control signal comprises a forward input signal and a reverse input signal;
   the noise reduction part comprises a first Schmitt trigger and a second Schmitt trigger; and
   an input end of the first Schmitt trigger is used to access the forward input signal, an input end of the second Schmitt trigger is used to access the reverse input signal, and an output end of the first Schmitt trigger and an output end of the second Schmitt trigger are connected to the input side of the logical driver.

8. The drive module according to claim 4, wherein the pull-up transistor is a PMOS transistor, the first end of the pull-up transistor is a source of the pull-up transistor, and the second end of the pull-up transistor is a drain of the pull-up transistor.

9. The drive module according to claim 1, wherein the drive module is arranged on a same chip.

10. A switch circuit comprising the drive module according to claim 1 and the GaN transistor.

11. An electronic device comprising the switch circuit according to claim 10.

12. The drive module according to claim 2, further comprising a drive unit and a pull-up transistor, wherein:
   an input side of the drive unit is used to access a control signal of the GaN transistor, a first end of the pull-up transistor is used to access a voltage source, a second end of the pull-up transistor is directly or indirectly connected to the gate of the GaN transistor, and a gate of the pull-up transistor and the gate of the first pull-down transistor are connected to an output side of the drive unit; and the drive unit is configured to control one of the pull-up transistor and the first pull-down transistor to turn on according to the control signal.

13. The drive module according to claim 3, further comprising a drive unit and a pull-up transistor, wherein:
an input side of the drive unit is used to access a control signal of the GaN transistor, a first end of the pull-up transistor is used to access a voltage source, a second end of the pull-up transistor is directly or indirectly connected to the gate of the GaN transistor, and a gate of the pull-up transistor and the gate of the first pull-down transistor are connected to an output side of the drive unit; and
the drive unit is configured to control one of the pull-up transistor and the first pull-down transistor to turn on according to the control signal.

14. The switch circuit according to claim 10, wherein the first pull-down transistor and the second pull-down transistor are NMOS transistors, the first end of the first pull-down transistor is a drain of the first pull-down transistor, the second end of the first pull-down transistor is a source of the first pull-down transistor, the first end of the second pull-down transistor is a drain of the second pull-down transistor, and the second end of the second pull-down transistor is a source of the second pull-down transistor.

15. The switch circuit according to claim 10, wherein the specified threshold matches a zero-volt voltage.

16. The switch circuit according to claim 10, wherein the drive module further comprises a drive unit and a pull-up transistor, wherein:
an input side of the drive unit is used to access a control signal of the GaN transistor, a first end of the pull-up transistor is used to access a voltage source, a second end of the pull-up transistor is directly or indirectly connected to the gate of the GaN transistor, and a gate of the pull-up transistor and the gate of the first pull-down transistor are connected to an output side of the drive unit; and
the drive unit is configured to control one of the pull-up transistor and the first pull-down transistor to turn on according to the control signal.

17. The switch circuit according to claim 16, wherein:
the drive unit comprises a logical driver, an input side of the logical driver is used to directly or indirectly access the control signal, and an output side of the logical driver is connected to the gate of the pull-up transistor and the gate of the first pull-down transistor;
the logical driver is configured to control the pull-up transistor to turn on and the first pull-down transistor to turn off when the control signal is a first control signal; and
the logical driver is configured to control the pull-up transistor to turn off and the first pull-down transistor to turn on when the control signal is a second control signal.

18. The drive module according to claim 1, wherein the gate voltage of the GaN transistor is directly applied to the gate of the second pull-down transistor.

19. A drive module for a GaN transistor comprising:
a first pull-down transistor having a first end connected to a gate of the GaN transistor and a second end; and
a gate ringing and overshoot suppression unit comprising a second pull-down transistor and a pull-down resistor, a first end of the pull-down resistor is connected to the second end of the first pull-down transistor, a second end of the pull-down resistor is connected to ground, a first end of the second pull-down transistor is connected to the second end of the first pull-down transistor, a second end of the second pull-down transistor is connected to ground, and a gate of the second pull-down transistor is directly connected to the gate of the GaN transistor such that a gate voltage of the GaN transistor is directly applied to the gate of the second pull-down transistor as an on/off signal which turns the second pull-down transistor on and off,
wherein the gate ringing and overshoot suppression unit is configured such that when the gate voltage of the GaN transistor drops, the gate ringing and overshoot suppression unit controls the release of a gate charge of the GaN transistor with a first impedance if the gate voltage is higher than a specified threshold and controls the release of the gate charge of the GaN transistor with a second impedance greater than the first impedance if the gate voltage is less than the specified threshold.

* * * * *